United States Patent
Kim

(10) Patent No.: US 10,230,289 B2
(45) Date of Patent: Mar. 12, 2019

(54) THREE-PHASE INVERTER FOR MOTOR

(71) Applicants: HYUNDAI MOTOR COMPANY, Seoul (KR); KIA MOTORS CORPORATION, Seoul (KR)

(72) Inventor: Yun Ho Kim, Seoul (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 15/644,550

(22) Filed: Jul. 7, 2017

(65) Prior Publication Data

US 2018/0175709 A1 Jun. 21, 2018

(30) Foreign Application Priority Data

Dec. 15, 2016 (KR) ........................ 10-2016-0171218

(51) Int. Cl.
*H02K 11/33* (2016.01)
*H02M 7/00* (2006.01)
*H05K 7/20* (2006.01)
*H05K 7/14* (2006.01)

(52) U.S. Cl.
CPC ............ *H02K 11/33* (2016.01); *H02M 7/003* (2013.01); *H05K 7/1432* (2013.01); *H05K 7/209* (2013.01); *H05K 7/2089* (2013.01); *H05K 7/20436* (2013.01)

(58) Field of Classification Search
CPC ..... H02K 11/33; H02M 7/003; H05K 7/2089; H05K 7/20436
See application file for complete search history.

(56) References Cited

U.S. PATENT DOCUMENTS

| 5,661,446 A  | * | 8/1997  | Anderson ............ H02K 41/031 |
| | | | 310/13 |
| 6,501,653 B1 | * | 12/2002 | Landsgesell ......... H02M 7/003 |
| | | | 165/185 |
| 2010/0066280 A1 | | 3/2010 | Marchand et al. |
| 2010/0327709 A1 | * | 12/2010 | Minato .................... H05K 1/18 |
| | | | 310/68 D |

(Continued)

FOREIGN PATENT DOCUMENTS

| JP | 2007-215340 A | 8/2007 |
| JP | 2015-104257 A | 6/2015 |

(Continued)

OTHER PUBLICATIONS

Office Action of corresponding Korean Patent Application No. 10-2016-0171218—5 pages, (dated May 18, 2018).

*Primary Examiner* — James Wu
*Assistant Examiner* — Michael A Matey
(74) *Attorney, Agent, or Firm* — Knobbe Martens Olson & Bear LLP

(57) ABSTRACT

Disclosed herein is a three-phase inverter system for a motor, which supplies three-phase power to a motor. The three-phase inverter system includes first, second, and third output units, and first, second, and third capacitors configured to supply power to the respective first, second, and third output units. The first output unit, the first capacitor, the second output unit, the second capacitor, the third output unit, and the third capacitor are radially arranged to form a hexagonal shape.

7 Claims, 6 Drawing Sheets

(56) References Cited

U.S. PATENT DOCUMENTS

| | | | | |
|---|---|---|---|---|
| 2011/0074323 A1* | 3/2011 | Mukai | .................. | B62D 5/0463 |
| | | | | 318/400.21 |
| 2015/0028779 A1* | 1/2015 | Mouty | ................... | H02P 25/22 |
| | | | | 318/244 |
| 2015/0255217 A1* | 9/2015 | Nishiyama | ............... | H01G 4/30 |
| | | | | 318/400.3 |
| 2018/0288907 A1* | 10/2018 | Richards | ............. | H01L 23/4093 |

FOREIGN PATENT DOCUMENTS

| | | |
|---|---|---|
| KR | 10-2008-0053992 A | 6/2008 |
| KR | 10-2009-0054738 A | 6/2009 |
| KR | 10-2015-0146187 A | 12/2015 |

* cited by examiner

THREE-PHASE INVERTER FOR MOTOR

CROSS REFERENCE TO RELATED APPLICATION

The present application claims priority of Korean Patent Application No. 10-2016-0171218 filed on Dec. 15, 2016, the entire contents of which is incorporated herein for all purposes by this reference.

BACKGROUND

Field

The present disclosure relates to a three-phase inverter for a motor, and, more particularly, to a three-phase inverter for a motor, which supplies three-phase power to a motor.

Description of the Related Art

Eco-friendly vehicles such as electric vehicle and hybrid vehicles have drive motors that are mounted therein to drive the vehicles.

A variety of methods of driving motors are known, and a three-phase motor is typically used as the vehicle drive motor. Accordingly, there is a need for a three-phase inverter that is able to individually supply powers of three U, V, and W phases.

As illustrated in FIG. 1, an inverter 1 has a box shape. The inverter 1 is coupled to one side of a cylindrical motor 2, and a reducer 3 is installed to the other side of the motor 2. However, it is difficult to couple the inverter 1 and the motor 2 since they have different shapes, and there is a problem in that the inverter 1 and the motor 2 have a complicated power connection structure since the powers of three phases have to be respectively supplied to radial positions in the motor 2.

Meanwhile, since a high-voltage power supply is required to operate a vehicle drive motor, there is a need for a cooler to cool the high-voltage power supply. In particular, efficiency of power modules and capacitors included in the inverter 1 is deteriorated due to heat, and cooling efficiency of the inverter 1 is one of important factors to reduce the size of the inverter.

Accordingly, there is a need for an inverter that has a simplified coupling structure with a motor and has high cooling efficiency.

The foregoing is intended merely to aid in the understanding of background of the present invention, and is not intended to mean that the present invention falls within the purview of the related art that is already known to those skilled in the art.

The disclosure of this section is to provide background of the invention. Applicant notes that this section may contain information available before this application. However, by providing this section, Applicant does not admit that any information contained in this section constitutes prior art.

SUMMARY

Accordingly, the present disclosure has been made keeping in mind the above problems occurring in the related art, and an aspect of the present invention proposes a three-phase inverter for a motor, the size of which can be reduced while having improved cooling efficiency by radially arranging power modules and capacitors therein.

In accordance with an aspect of the present invention, a three-phase inverter for a motor, which supplies three-phase power to a motor, the three-phase inverter includes first, second, and third output units, and first, second, and third capacitors configured to supply power to the respective first, second, and third output units, wherein the first output unit, the first capacitor, the second output unit, the second capacitor, the third output unit, and the third capacitor are radially arranged to form a hexagonal shape.

The first capacitor may be disposed between the first output unit and the second output unit, the second capacitor may be disposed between the second output unit and the third output unit, and the third capacitor may be disposed between the third output unit and the first output unit.

The first output unit may include a first frame, a first power module installed to the first frame so as to convert the power supplied from the first capacitor into V-phase power and supply the V-phase power to the motor, and a first cooler installed to the first frame to cool the first power module and the first and third capacitors. The second output unit may include a second frame, a second power module installed to the second frame so as to convert the power supplied from the second capacitor into U-phase power and supply the U-phase power to the motor, and a second cooler installed to the second frame to cool the second power module and the second and first capacitors. The third output unit may include a third frame, a third power module installed to the third frame so as to convert the power supplied from the third capacitor into W-phase power and supply the W-phase power to the motor, and a third cooler installed to the third frame to cool the third power module and the third and first capacitors.

The three-phase inverter may further include a bus bar disposed on one surface of hexagonal structure formed by the first output unit, the first capacitor, the second output unit, the second capacitor, the third output unit, and the third capacitor, which are radially arranged, so as to supply power to each of the first, second, and third capacitors.

The bus bar may include a positive plate connected to an anode of a battery and a negative plate connected to a cathode of the battery, the positive and negative plates being laminated to each other in an insulated state.

The positive plate may have a positive input terminal connected to the battery, a first positive terminal connected to the first capacitor, a second positive terminal connected to the second capacitor, and a third positive terminal connected to the third capacitor. The negative plate may have a negative input terminal connected to the battery, a first negative terminal connected to the first capacitor, a second negative terminal connected to the second capacitor, and a third negative terminal connected to the third capacitor.

The three-phase inverter may further include a housing configured to surround the first output unit, the first capacitor, the second output unit, the second capacitor, the third output unit, and the third capacitor. The housing may be opened at one side thereof so as to allow the power supplied from the first, second, and third output units to be transmitted to the motor, and may have input holes formed at the other side thereof so as to allow power to be supplied to the second and third capacitors.

The positive and negative input terminals may be formed at positions at which ends thereof correspond to the input holes.

As apparent from the above description, the three-phase inverter for a motor according to embodiments of the present invention has the following effects.

Firstly, it is possible to easily supply three-phase power to the motor since the power modules and the capacitors are radially arranged in the inverter.

Secondly, it is possible to reduce the size of the inverter for miniaturization.

Thirdly, it is possible to improve cooling efficiency through the structure that simultaneously cools the power modules and the capacitors.

Fourthly, it is possible to reduce the sizes and weights of the capacitors by the improvement in cooling efficiency.

BRIEF DESCRIPTION OF THE DRAWINGS

Features and advantages of the present invention will be more clearly understood from the following detailed description taken in conjunction with the accompanying drawings, in which.

DESCRIPTION OF EMBODIMENTS

Figure 1:
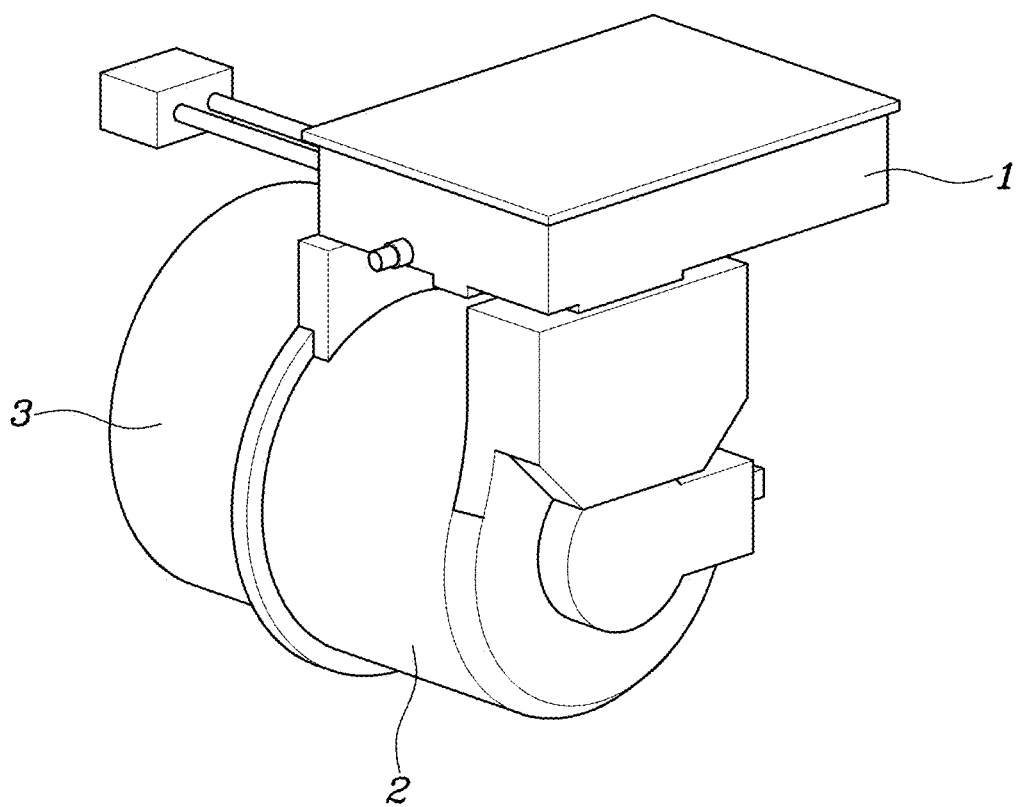
FIG. 1 is a view illustrating a connection relationship between an inverter and a drive motor in the related art.

The terminology used in this disclosure is for the purpose of describing embodiments only and is not intended to limit the invention. As used in the specification and the appended claims, the singular forms are intended to include the plural forms as well, unless context clearly indicates otherwise. It will be further understood that the terms "comprises" and/or "comprising," when used in this specification, specify the presence of stated features, regions, integers, steps, operations, elements, and/or components, but do not preclude the presence or addition of one or more other features, regions, integers, steps, operations, elements, and/or components thereof.

Unless otherwise defined, all terms, including technical and scientific terms, used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

An aspect of the present invention provides a wheel-driving motor system in a vehicle. The motor system includes an electrical motor configured to generate driving force for at least one wheel of a vehicle, a gear mechanism (speed reducer) connected to the motor, and an inverter system configured to supply electrical power (AC) from a battery of the vehicle to the motor.

In embodiments, in a direction parallel to rotational axis of the motor, the motor, the gear mechanism and the inverter system (housed respectively in their housings) is arranged in older. In embodiments, a housing of the motor, a housing of the gear mechanism, and a housing of the inverter system is arranged in order in a direction parallel to rotational axis of the motor.

In embodiments, the inverter system includes at least three inverters and at least three capacitors. The at least three inverters comprises a first inverter 111 configured to provide AC power in a first phase of the motor, a second inverter 131 configured to configured to provide AC power in a second phase of the motor, and a third inverter 151 configured to provide AC power in a third phase of the motor. The at least three capacitors includes a first capacitor 120 configured to supply power from a battery of the vehicle toward the first inverter, a second capacitor 140 configured to supply power from the battery toward the second inverter, a third capacitor 160 configured to supply power from the battery toward the first inverter, In embodiments, inside a housing of the inverter system, in a cross-section perpendicular to rotational axis of the motor, the first inverter 111, the first capacitor 120, the second inverter 131, the second capacitor 140, the third inverter 151, the third capacitor 160 are arranged in order along a circumferential direction. In embodiments, each one of the inverters (for example, first inverter 111) is disposed in a space defined between two neighboring capacitors (first capacitor 120, third capacitor 160) along a circumferential direction in a single cylindrical housing 101.

In embodiments, in a cross-section perpendicular to rotational axis of the motor, a first inverter 111 of the first phase is placed over (outer in a radial direction) a first frame 114. A first cooler 112 is installed under the first frame 114 (inner in a radial direction). The first frame 114 is mechanically, thermally connected to two immediately neighboring (in a circumferential direction) capacitors of the first inverter 111 such that the cooler provides cooling to the first inverter 11 and the two neighboring capacitors (in embodiments, the first capacitor 120 and the third capacitor 160) at the same time via thermal connection of the first frame.

A three-phase inverter for a motor according to an embodiment of the present invention will be described below with reference to the accompanying drawings.

Figure 2:
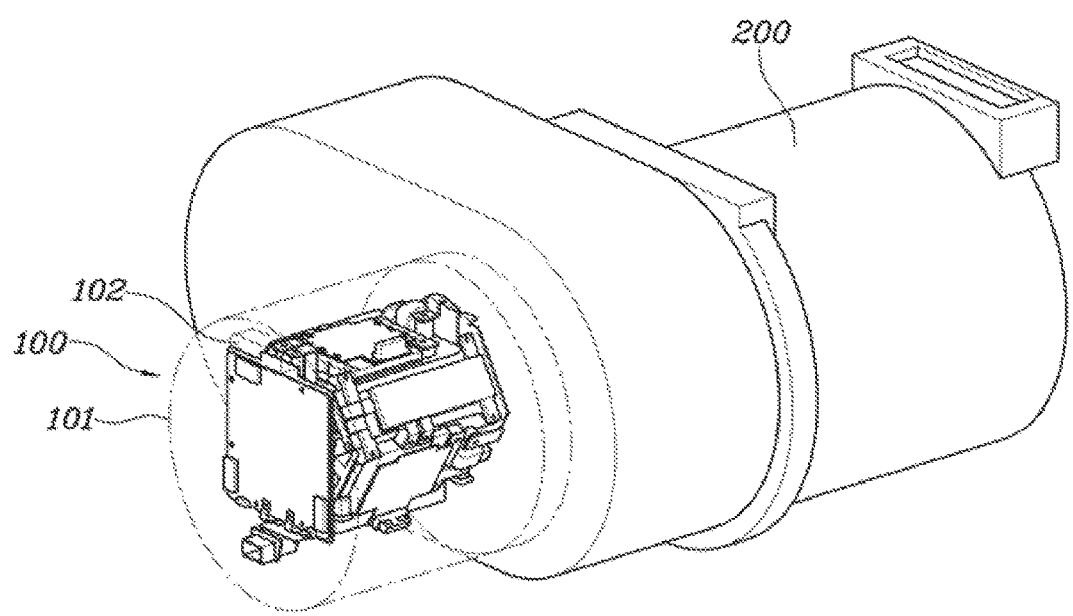
FIG. 2 is a view illustrating a connection relationship between an inverter and a drive motor according to an embodiment of the present invention.
Figure 3:
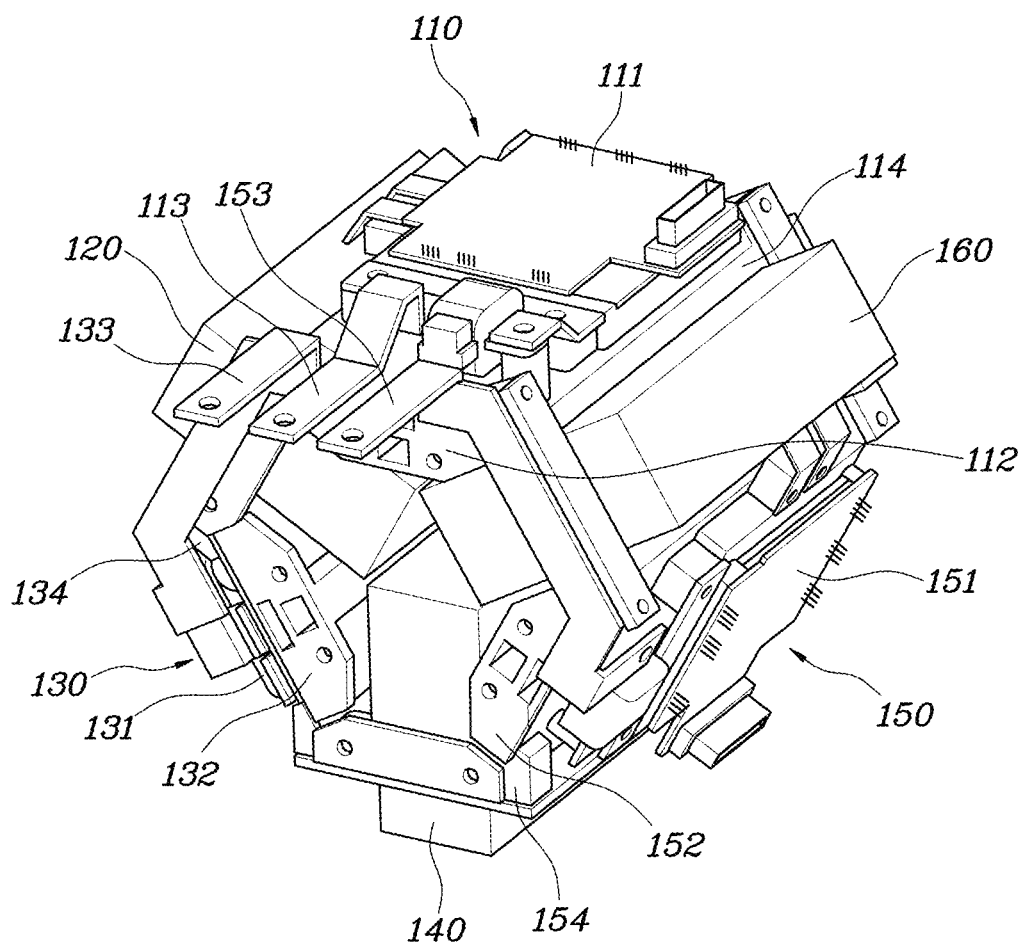
FIG. 3 is a perspective view illustrating the front of the inverter according to embodiments of the present invention.
Figure 4:
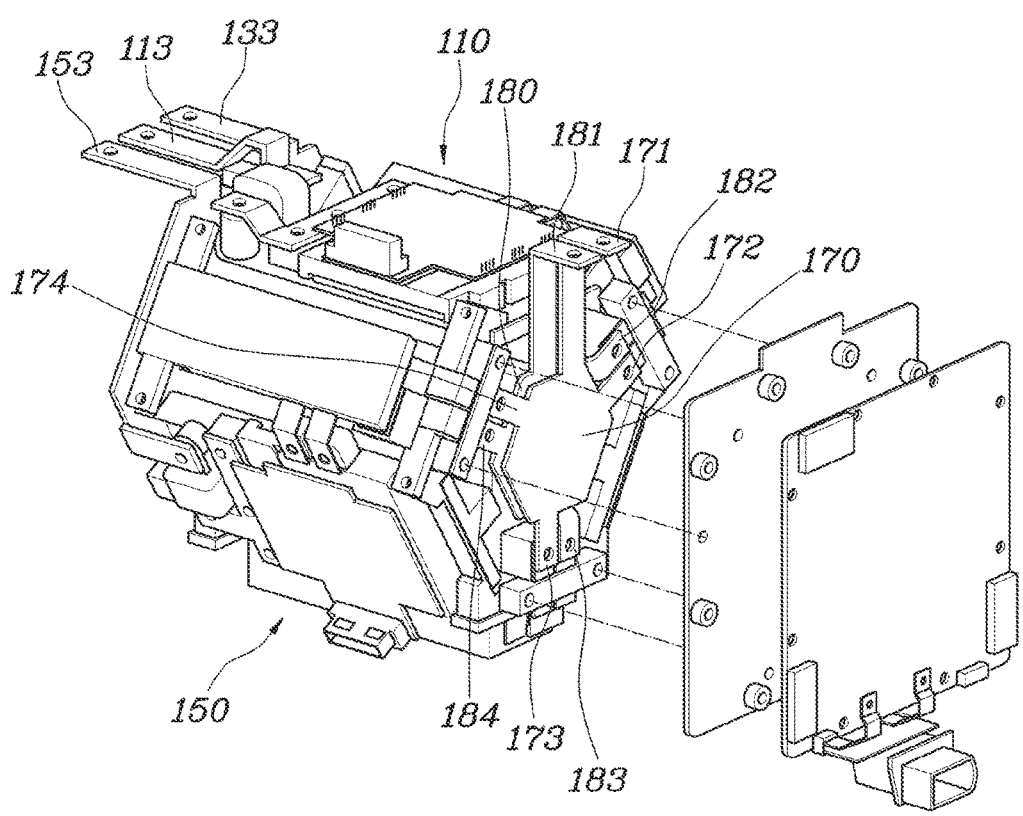
FIG. 4 is a perspective view illustrating the rear of the inverter according to embodiments of the present invention.
Figure 5:
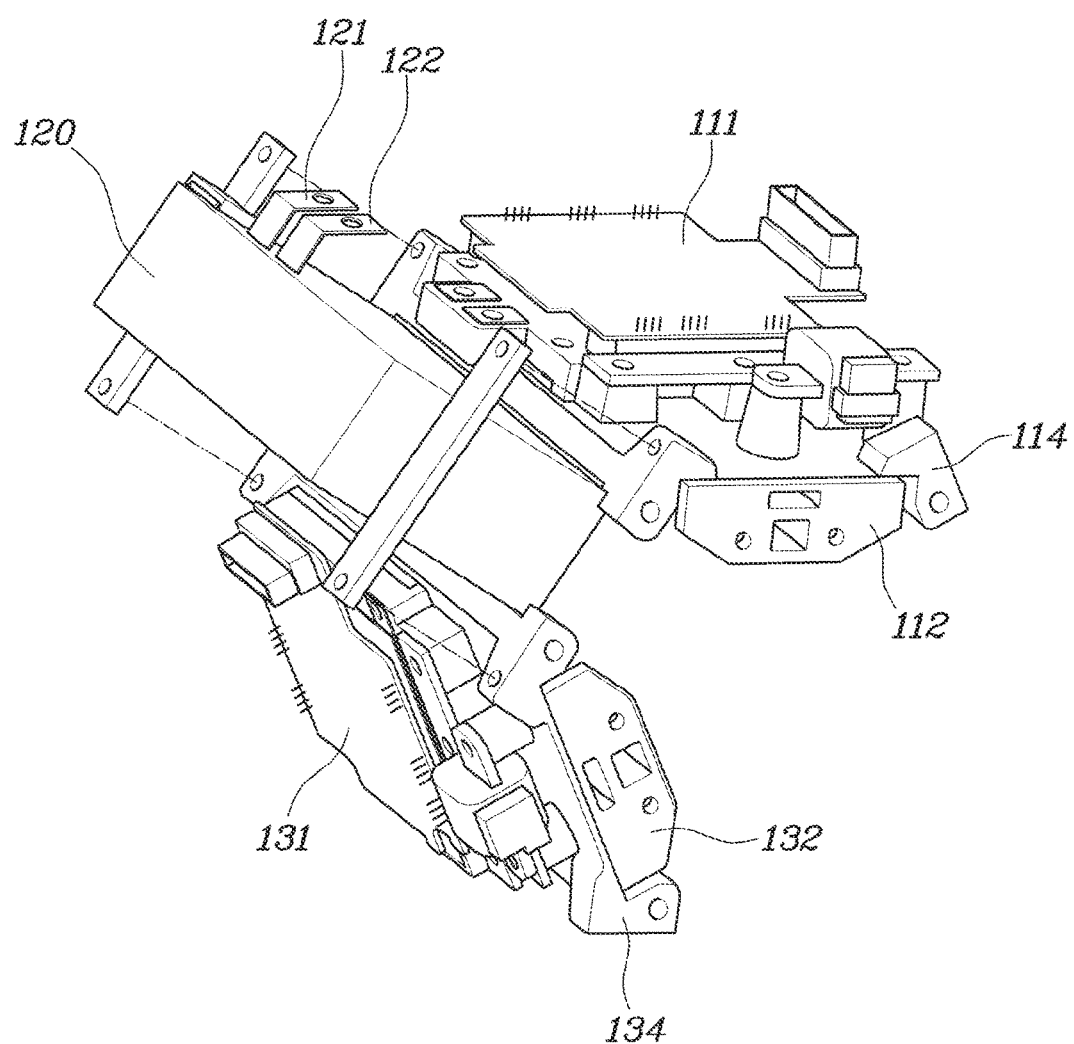
FIG. 5 is a perspective view illustrating a connection state between an output unit and a capacitor in the inverter according to embodiments of the present invention.
Figure 6:
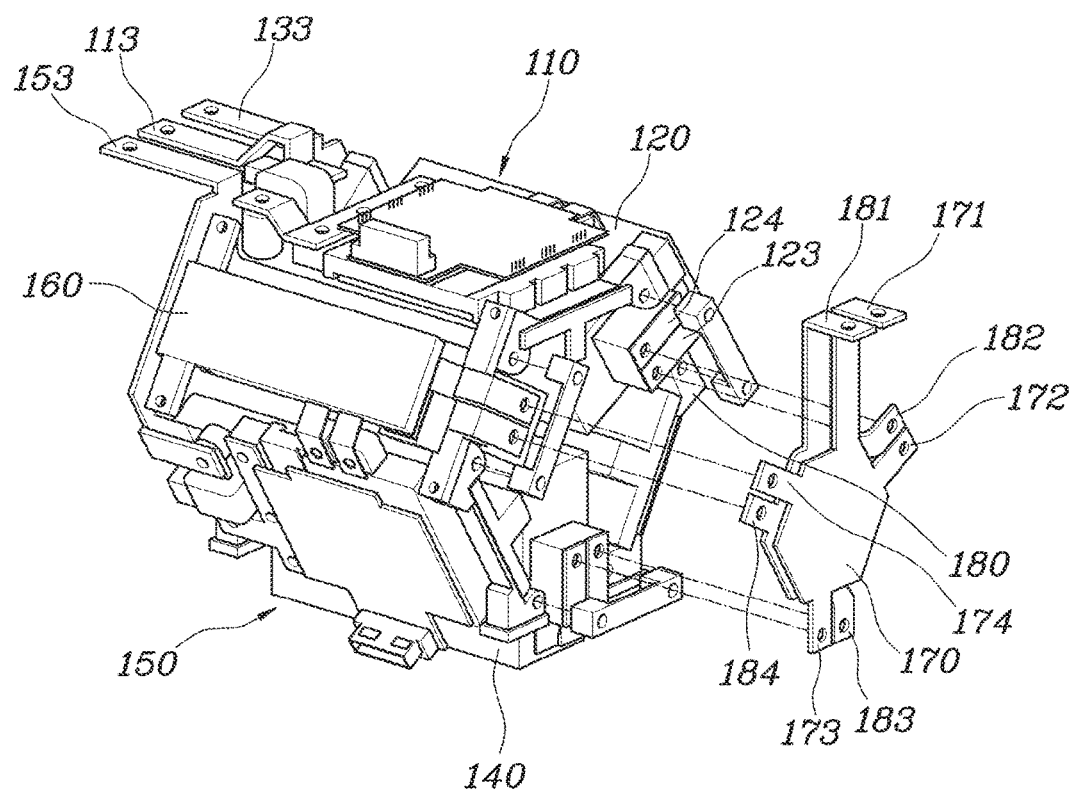
FIG. 6 is a perspective view illustrating a state before assembly of the rear of the inverter according to embodiments of the present invention.

As illustrated in FIGS. 2 to 6, the inverter, which is designated by reference numeral 100, according to embodiments of the present invention includes three output units, namely first, second, and third output units 110, 130, and 150 that respectively supply U-, V-, and W-phase powers to a motor 200, and first, second, and third capacitors 120, 140, and 160 that stabilize the power supplied to each of the output units.

In this case, the output units and the capacitors are radially arranged to form a dense hexagonal shape so as to be installable in a cylindrical housing that will be described later. Hereinafter, each component of the inverter will be described in more detail.

The first output unit 110 largely includes a first frame 114, a first power module 111, and a first cooler 112. The first frame 114 supports the first power module 111 and the first cooler 112, and fixes the first capacitor 120 together with a second frame 134 that will be described in detail later.

The first frame 114 has a plate shape. The first cooler 112 is installed on the lower surface of the first frame 114, and the first power module 111 is installed on the upper surface of the first frame 114. The first frame 114 serves as a type of heat sink, and transfers heat generated by the first power module 11 toward the first cooler 112.

The first power module (inverter) 111 converts DC power supplied from a battery into one phase power of three-phase AC power. In this case, the first power module 111 takes charge of V-phase power of three-phase power. The power output from the first power module 111 is transmitted to a motor 200 through a first output terminal 113.

The first cooler 112 indirectly cools the first power module 111 through the first frame 114. In addition, the first cooler 112 also cools the first and third capacitors 120 and 160 since the first and third capacitors 120 and 160 are respectively installed on both sides of the first cooler 112 so as to come into contact therewith.

The second and third output units 130 and 150 are arranged in a triangular form together with the first output unit 110. The configurations of the second and third output units 130 and 150 are nearly identical to that of the first output unit 110.

That is, the second output unit 130 includes a second frame 134, a second power module (inverter) 131, and a second cooler 132, and the third output unit 150 includes a third frame 154, a third power module (inverter) 151, and a third cooler 152.

However, a second output terminal 133, through which U-phase power output from the second output unit 130 is transmitted to the motor 200, and a third output terminal 153, through which W-phase power output from the third output unit 150 is transmitted to the motor 200, differ from the first output terminal 113 in terms of shape.

The different shapes of the first, second, and third output terminals 113, 133, and 153 enable the three output terminals to be connected to the motor 200 in a state in which they are adjacent to one another, thereby minimizing a leakage inductance.

The first capacitor 120 serves to transmit DC power from the battery to the first power module 111. The first capacitor 120 temporarily stores the electricity supplied from the battery, and then supplies it to the first power module 111 by a certain amount in order to uniformly maintain voltage and current supplied to the first power module 111.

The capacity of the first capacitor 120 is proportional to its size and is reduced according to the increase in temperature, and it is therefore important to effectively cool the first capacitor 120 to reduce the size thereof. To this end, the first capacitor 120 is cooled by the first cooler 112 of the first output unit 110 and the second cooler 132 of the second output unit 130 that are installed adjacent to the first capacitor 120.

The first capacitor 120 has a plurality of electrodes installed thereto. That is, the first capacitor 120 has an eleventh electrode 121 that is connected to a positive terminal of the first power module 111, a twelfth electrode 122 that is connected to a negative terminal of the first power module 111, and thirteenth and fourteenth electrodes 123 and 124 that are connected to bus bars 170 and 180 to be described later.

The power, which is supplied from the battery to the thirteenth and fourteenth electrodes 123 and 124 through the bus bars 170 and 180, is temporarily stored in the first capacitor 120, and is then supplied to the first power module 111 through the eleventh and twelfth electrodes 121 and 122.

The second and third capacitors 140 and 160 are arranged in an inverted triangular form together with the first capacitor 120, unlike the first, second, and third output units 110, 130, and 150, so that the output units and the capacitors are alternately arranged.

The shapes and configurations of the second and third capacitors 140 and 160 are identical to those of the first capacitor 120. The second and third capacitors 140 and 160 supply power, which is supplied to the bus bars 170 and 180, to the second and third output units 130 and 150, respectively.

The bus bars 170 and 180 form a laminated structure in which positive and negative plates 170 and 180 are laminated to each other. The bus bars 170 and 180 have input terminals that are connected to the battery, and positive or negative terminals that are connected to the respective output units.

That is, the positive plate 170 has a positive input terminal 171 that is connected to the anode of the battery, a first positive terminal 172 that is connected to the first capacitor 120, a second positive terminal 173 that is connected to the second capacitor 140, and a third positive terminal 174 that is connected to the third capacitor 160. The negative plate 180 has a negative input terminal 181 that is connected to the cathode of the battery, a first negative terminal 182 that is connected to the first capacitor 120, a second negative terminal 183 that is connected to the second capacitor 140, and a third negative terminal 184 that is connected to the third capacitor 160.

The first, second, and third output units 110, 130, and 150, the first, second, and third capacitors 120, 140, and 160, and the bus bars 170 and 180 are installed in a cylindrical housing 101 to be coupled to the motor 200.

The housing 101 is opened at one surface thereof toward the motor 200, and has input holes 102 that are formed in the other surface thereof. The input holes 102 are formed at positions corresponding to the ends of the positive and negative input terminals 171 and 181 so that wires extending from the battery are inserted into the input holes 102 and are connected to the positive and negative input terminals 171 and 181.

It will be apparent to those skilled in the art that various modifications and variations can be made in the present invention without departing from the spirit or scope of the inventions. Thus, it is intended that the present disclosure covers modifications and variations of this invention provided they come within the scope of the appended claims and their equivalents.

Although embodiments of the present invention have been disclosed for illustrative purposes, those skilled in the art will appreciate that various modifications, additions and substitutions are possible.

What is claimed is:

1. A three-phase inverter for supplying three-phase power to a motor, the three-phase inverter comprising:
    a hexagonal body comprising six sides;
    first, second, and third output units; and
    first, second, and third capacitors configured to supply power to the respective first, second, and third output units,
    wherein the first output unit is located on a first one of the six sides, the first capacitor is located on a second one of the six sides, the second output unit is located on a third one of the six sides, the second capacitor is located on a fourth one of the six sides, the third output unit is located on a fifth one of the six sides, and the third capacitor is located on a sixth one of the six sides,
    wherein the first capacitor is disposed between the first output unit and the second output unit,
    wherein the second capacitor is disposed between the second output unit and the third output unit,
    wherein the third capacitor is disposed between the third output unit and the first output unit.

2. The three-phase inverter according to claim 1, wherein:
    the first output unit comprises a first frame, a first power module installed to the first frame so as to convert the power supplied from the first capacitor into V-phase power and supply the V-phase power to the motor, and a first cooler installed to the first frame to cool the first power module and the first and third capacitors;

the second output unit comprises a second frame, a second power module installed to the second frame so as to convert the power supplied from the second capacitor into U-phase power and supply the U-phase power to the motor, and a second cooler installed to the second frame to cool the second power module and the second and first capacitors; and the third output unit comprises a third frame, a third power module installed to the third frame so as to convert the power supplied from the third capacitor into W-phase power and supply the W-phase power to the motor, and a third cooler installed to the third frame to cool the third power module and the third and first capacitors.

3. The three-phase inverter according to claim 1, further comprising: a bus bar disposed on one surface of hexagonal structure formed by the first output unit, the first capacitor, the second output unit, the second capacitor, the third output unit, and the third capacitor so as to supply power to each of the first, second, and third capacitors.

4. The three-phase inverter according to claim 3, wherein the bus bar comprises a positive plate connected to an anode of a battery and a negative plate connected to a cathode of the battery, the positive and negative plates being laminated to each other in an insulated state.

5. The three-phase inverter according to claim 4, wherein:
the positive plate has a positive input terminal connected to the battery, a first positive terminal connected to the first capacitor, a second positive terminal connected to the second capacitor, and a third positive terminal connected to the third capacitor; and the negative plate has a negative input terminal connected to the battery, a first negative terminal connected to the first capacitor, a second negative terminal connected to the second capacitor, and a third negative terminal connected to the third capacitor.

6. The three-phase inverter according to claim 5, further comprising a housing configured to surround the first output unit, the first capacitor, the second output unit, the second capacitor, the third output unit, and the third capacitor,
wherein the housing is opened at one side thereof so as to allow the power supplied from the first, second, and third output units to be transmitted to the motor, and has input holes formed at the other side thereof so as to allow power to be supplied to the second and third capacitors.

7. The three-phase inverter according to claim 6, wherein the positive and negative input terminals are formed at positions at which ends thereof correspond to the input holes.

* * * * *